(12) United States Patent
Verjans

(10) Patent No.: US 7,994,709 B2
(45) Date of Patent: Aug. 9, 2011

(54) OLED DEVICE EMPLOYING A METAL THIN-FILM CONNECTED TO A HIGH-CURRENT CABLE

(75) Inventor: Conrad Wilhelmus Adriaan Verjans, Landgraaf (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 301 days.

(21) Appl. No.: 12/300,374

(22) PCT Filed: May 11, 2007

(86) PCT No.: PCT/IB2007/051785
§ 371 (c)(1),
(2), (4) Date: Nov. 11, 2008

(87) PCT Pub. No.: WO2007/135604
PCT Pub. Date: Nov. 29, 2007

(65) Prior Publication Data
US 2009/0160321 A1    Jun. 25, 2009

(30) Foreign Application Priority Data
May 22, 2006  (EP) .................................. 06114318

(51) Int. Cl.
*H05K 3/36* (2006.01)
*H05B 33/00* (2006.01)
(52) U.S. Cl. ........................ 313/504; 313/331
(58) Field of Classification Search ................. None
See application file for complete search history.

(56) References Cited

U.S. PATENT DOCUMENTS

| | | | |
|---|---|---|---|
| 3,650,454 A | 3/1972 | Coucoulas | |
| 4,640,581 A | 2/1987 | Nakanowatari et al. | |
| 5,043,716 A | 8/1991 | Latz et al. | |
| RE38,053 E | 4/2003 | Kanezawa | |
| 7,462,384 B2 * | 12/2008 | Yamazaki et al. | 428/68 |
| 2004/0149998 A1 | 8/2004 | Henson et al. | |
| 2005/0052123 A1 * | 3/2005 | Suzuki et al. | 313/504 |
| 2005/0093427 A1 | 5/2005 | Wang et al. | |
| 2005/0190333 A1 | 9/2005 | Wu et al. | |
| 2005/0199786 A1 | 9/2005 | Yoshida et al. | |
| 2005/0270757 A1 | 12/2005 | Credelle et al. | |
| 2006/0061270 A1 * | 3/2006 | Uhlig et al. | 313/506 |
| 2007/0103055 A1 * | 5/2007 | Tomai et al. | 313/503 |

FOREIGN PATENT DOCUMENTS

| | | |
|---|---|---|
| EP | 0232127 A2 | 1/1987 |
| EP | 0911678 A2 | 4/1999 |
| FR | 2515917 | 5/1983 |

OTHER PUBLICATIONS

E.J. Stofel et al; "Long-Life, Lightweight Solar Array Testing", Photovoltaic Specialists Conf., Kissimmee, May 1, 1984, New York, NY, US, vol. 3, Conf. 17, pp. 173-178, XP000043889.

* cited by examiner

*Primary Examiner* — Ashok Patel

(57) ABSTRACT

An interconnection arrangement for interconnecting a high-current carrying cable with a metal thin-film (3, 4) on a transparent and insulating substrate (1). According to the invention the high-current carrying cable is designed as a flat cable (5) and the inter-connection between the flat cable and the metal thin-film (3, 4) is an ultrasonic weld joint (6a, 7a).

8 Claims, 1 Drawing Sheet

OLED DEVICE EMPLOYING A METAL THIN-FILM CONNECTED TO A HIGH-CURRENT CABLE

This application is a national stage application under 35 U.S.C. §371 of International Application No. PCT/IB2007/051785 filed on May 11, 2007, and published in the English language on Nov. 29, 2007 as International Publication No. WO/2007/135604, which claims priority to European Application No. 06114318.6, filed on May 22, 2006, incorporated herein by reference.

The present patent application relates in general to the field of the interconnection of high-current carrying electronic components, especially in OLED lighting devices.

Solid-state lighting has become an important part of the illumination market. Solid-state lighting (SSL) units, such as organic light emitting diodes (OLED), provide lighting at low cost, and thus are predestined for the general illumination market. In order to provide OLED lighting units with high output, the components of the respective lighting unit including their interconnections must be designed for high currents. Correspondingly, low-ohm resistance of both the individual components and their respective interconnections is crucial. In particular, this applies for the electrical interconnection between the OLED and the its driver unit.

From the prior art two types of interconnection are currently known.

The first type is soldering. As generally known soldering uses the heat of a hot bar to melt a solder which provides the interconnection between a wire and the contact area of the printed circuit board.

The second type of interconnection is heat-sealing. Generally speaking, the process of heat-sealing consists in creating electrical conductive adhesive bonds between flexible and rigid circuit boards, glass panel displays and flex foils. The essential characteristics of this process are heating and cooling of the adhesive under pressure. Anisotropic conductive adhesives, such as Anisotropic Conductive Films (ACF), contain small conductive particles that, when compressed and heated, form an electrical interconnection between parts. The adhesives are widely used to connect the electrically conductive areas on a liquid crystal display (LCD) to a PCB via a flexible circuit with conductive tracks.

The main problem of both the soldering process and the heat-sealing process is that they need to be executed at temperatures above the evaporating temperature of the organic materials in the OLED. Further, OLEDs of current design contain very thin Chrome or MAM (Molybdenum-Aluminium-Molybdenum) layers (about 250 nm thickness each) on a glass substrate. An attempt to solder a wire to such a thin layer inevitably leads to a flaking of the respective layer as the heat cannot be carried away.

As mentioned above, heat-sealing is widely used in display applications. However, it cannot be efficiently applied in lighting applications. In addition, heat-sealing interconnections are not sufficiently stable in the case of high-current conduction.

It is thus an object of the invention to provide an interconnection arrangement for interconnecting a high-current carrying cable with a metal thin-film on an insulating substrate which is cost-effective and sufficiently stable under high-current conditions. It is a further object of the invention to provide a method for interconnecting a high-current carrying cable with a metal thin-film on an insulating substrate which avoids excessive load of the materials involved in the process. It is another object of the invention to provide a lighting device which features a high luminous intensity and a compact design while being cost-effective.

These and other objects are solved by a interconnection arrangement for interconnecting a high-current carrying cable with a metal thin-film on a transparent and insulating substrate, wherein the high-current carrying cable is designed as a flat cable and the interconnection between the flat cable and the metal thin-film is an ultrasonic weld joint.

In this connection thin-films are preferably referred to as submicron films, e.g. films of 100 to 250 nm thickness.

An advantage of the interconnection arrangement according to the invention is that the flat cable which is used as a high-current carrying cable is a low-cost component with standard dimensions which is commonly used in consumer electronics. Moreover, the flat cable ensures a large area of contact which additionally lowers the ohmic resistance. By using ultrasonic welding high temperatures which inevitably would cause degradation of the organic material in the OLED are reliably avoided. Furthermore, the ultrasonic welding process is fast and accurate, thus minimizing production costs.

Ultrasonic welding is known from the prior art (e.g. U.S. Pat. No. 3,650,454). In U.S. Pat. No. 5,043,716 a method for assembling a LED matrix display is described in which each individual LED die is connected to a conductive pad by means of a bond wire which for its part is interconnected to the die and the conductive pad via ultrasonic welding. As the LED display is a typical low-current application the individual interconnections are not optimized with regard to stability and low resistance under high-current conditions. US 2005/0270757 A1 describes an assembly method to bring multiple chips together on one carrier substrate. The carrier substrate is made of plastic, fabric or metal and there is no metal thin-film disposed on the carrier. In addition, the assembly is to be used in low-current display application.

According to an embodiment of the present invention the ultrasonic weld joint may be a spot weld joint. Spot weld joints can be produced in a fast sequence using automated welding equipment which is available in the market. Alternatively, the ultrasonic weld joint may be a line weld joint.

According to another embodiment of the invention the transparent and insulating substrate is a glass substrate. Glass substrates are available for various lighting applications at low costs, high precision and high transparency. As alternative, the substrate may also be made of a transparent and insulating plastic material.

As the interconnection arrangement is designed for high-current applications, such as OLED lighting, low-ohm resistance of every component involved is of particular importance. Consequently, it is advantageous to use cable material with minimal specific electric resistance. Suitable materials are therefore copper, aluminum or silver.

Although the ultrasonic weld joint itself represents a very firm interconnection type it is practical to further mechanically strengthen the interconnection between the flat cable and the metal thin-film. This may be achieved according to an advantageous embodiment of the invention by covering the ultrasonic weld joint and a region around the ultrasonic weld joint at least partly with glue, wherein the glue may be a UV curable glue or a glue containing silicon or another suitable material. Herein, the glue covering the ultrasonic weld joint and a region around it serves as a mechanical strain relief.

As already mentioned above the metal of the metal thin-film may comprise copper. According to another embodiment of the invention the metal thin-film may comprise chrome or a molybdenum-aluminum-molybdenum layer system. Generally, any metal featuring a low specific electric resistance is suitable for the metal thin-film.

A further aspect of the application is a method for interconnecting a high-current carrying cable with a metal thin-film on a transparent and insulating substrate, comprising a step of providing a flat cable as the high-current carrying cable and a step of interconnecting the flat cable with the metal thin-film by ultrasonic welding.

A further aspect of the application is a lighting device comprising an OLED lighting means comprising a metal thin-film on a glass substrate and a driver unit being interconnected to the OLED lighting means by means of a high-current cable, wherein the high-current cable is designed as a flat cable, said flat cable being interconnected to the metal thin-film of the OLED lighting means by means of at least one ultrasonic weld joint.

A further aspect of the application is the use of the interconnection arrangement described above for interconnecting solar modules.

These and other aspects of the application will become apparent from and elucidated with reference to the following figures.

Figure 1:
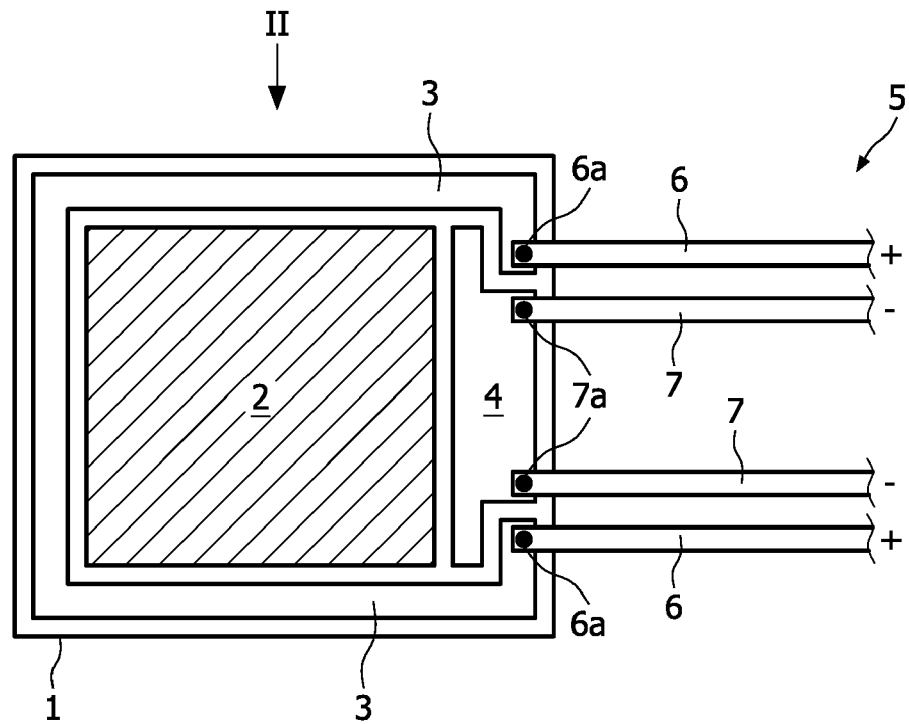
FIG. 1 illustrates a top view of an OLED lighting device.
Figure 2:
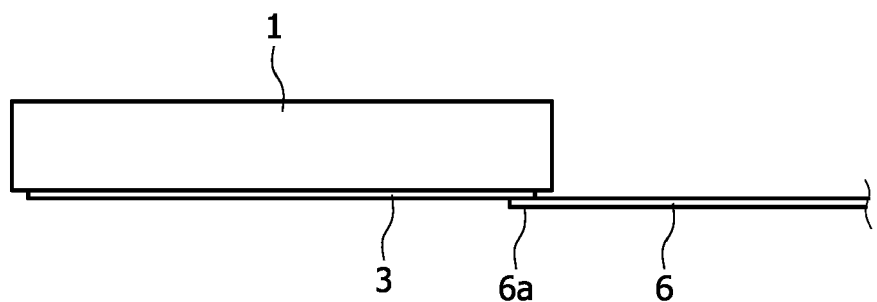
FIG. 2 illustrates a side view of the device of FIG. 1 corresponding to view direction II in FIG. 1.

FIG. 1 shows a top view of a OLED lighting device. The device comprises a transparent and insulating substrate 1 made of glass. A stack of organic layers 2, which forms the luminous area of the lighting device, is arranged on the surface of the glass substrate 1. The stack 2 is enclosed by planar sections 3, 4 of a metal thin-film of approx. 250 nm thickness each. The metal thin-film may comprise various metals, such as copper, chrome or even a layer system, such as a molybdenum-aluminum-molybdenum layer system. In the embodiment shown in FIG. 1 the metal thin-film is made of copper.

According to the invention the lighting device further comprises a flat cable 5 as a high-current carrying cable, which interconnects the lighting device to a driver unit (not shown). The specific advantage of a flat cable is that, on the one hand, it is a low-cost component commonly used in consumer electronics and that, on the other hand, it ensures a large area of contact which additionally lowers the ohmic resistance. Presently, the flat cable 5 is designed as a four-wire flat cable with the cable cores 6, 7 made of aluminum. Any other metal having a low specific electric resistance is also suitable, such as copper or silver. The cable cores 6, 7 are each approximately 1 mm in width and approximately 0.2 mm in thickness. The cable pitch of the flat cable 5 is about 1.5 mm. It will be understood that using cable cores with any other suitable width and thickness and flat cables with any other suitable cable pitch is obvious to one skilled in the art.

The outer cable cores 6 of the flat cable 5 are interconnected to the positive pole of the driver unit and the inner cable cores 7 are interconnected to the negative pole of the driver unit. On the side of the lighting device the outer cable 6 cores are interconnected to planar section 3 of the lighting device and the inner cable 7 cores are interconnected to planar section 4 of the lighting device.

According to the invention the individual ends of the cable cores 6, 7 of the flat cable 5 are interconnected to the planar sections 3, 4 of the lighting device by means of ultrasonic weld joints, presently spot weld joints 6a, 7a. This has the advantage that high temperatures which would cause degradation of the organic material in the OLED are reliably avoided during the welding process. The ultrasonic welding process further can be carried out in a fast and accurate way, thus minimizing production costs.

Figure 3:
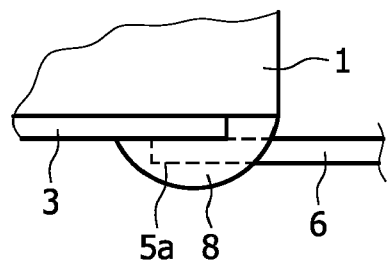
FIG. 3 illustrates a cutout view of an embodiment of the interconnection arrangement according to the invention.

In FIG. 3 another advantageous embodiment of the lighting device according to the invention is shown. According to the embodiment the ultrasonic weld joints 6a, 7a and a region around the ultrasonic weld joints 6a, 7a are covered with glue 8. This additionally strengthens the interconnection between the flat cable 5 and the metal thin-film of the planar sections 3, 4 and serves as a mechanical strain relief. Consequently, peeling-off of the flat cable is securely avoided. The glue may be a UV curable glue or a glue containing silicon or another suitable material.

According to another advantageous embodiment of the lighting device according to the invention (not shown) the interconnection between the flat cable and the printed circuit board is also an ultrasonic weld joint which gives a uniform approach on both sides of the cable.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. It should also be recognised that any reference signs shall not be constructed as limiting the scope of the claims.

The invention claimed is:

1. Lighting device comprising:
   an OLED lighting means comprising a metal thin-film disposed on a transparent and insulating substrate,
   a driver unit in electrical communication with the OLED lighting means by means of a high-current cable,
   wherein the high-current cable is a substantially flat cable interconnected to the metal thin-film of the OLED lighting means by means of at least one ultrasonic weld joint.

2. The lighting device of claim 1, wherein said transparent and insulating substrate comprises glass or a plastic material.

3. The lighting device of claim 1, wherein the driver unit is arranged on a printed circuit board.

4. The lighting device of claim 3, wherein the interconnection between the flat cable and the printed circuit board is an ultrasonic weld joint.

5. The lighting device of claim 1, wherein the ultrasonic weld joint is a spot weld joint or a line weld joint.

6. The lighting device of claim 1, wherein the flat cable comprises copper, aluminum, or silver.

7. The lighting device of claim 1, wherein at least the ultrasonic weld joint is at least partially covered with UV curable glue or a silicone glue.

8. The lighting device of claim 1, wherein the metal of the metal thin-film comprises copper, chrome, or a molybdenum-aluminum-molybdenum multi-layer structure.

* * * * *